(12) United States Patent
Chen et al.

(10) Patent No.: US 11,665,484 B2
(45) Date of Patent: May 30, 2023

(54) PACKAGE STRUCTURE OF MICRO SPEAKER

(71) Applicant: Fortemedia, Inc., Santa Clara, CA (US)

(72) Inventors: Li-Jen Chen, Hsinchu (TW); Yu-Min Fu, Hsinchu (TW); Yu-Ting Cheng, Hsinchu (TW); Shih-Chin Gong, Taipei (TW)

(73) Assignee: FORTEMEDIA, INC., Alviso (CA)

( * ) Notice: Subject to any disclaimer, the term of this patent is extended or adjusted under 35 U.S.C. 154(b) by 111 days.

(21) Appl. No.: 17/507,927

(22) Filed: Oct. 22, 2021

(65) Prior Publication Data

US 2022/0141595 A1    May 5, 2022

(30) Foreign Application Priority Data

Oct. 29, 2020   (CN) .......................... 202011177909.6

(51) Int. Cl.
*H04R 19/00* (2006.01)
*B81B 3/00* (2006.01)
*H04R 9/06* (2006.01)

(52) U.S. Cl.
CPC ......... *H04R 19/005* (2013.01); *B81B 3/0018* (2013.01); *H04R 9/06* (2013.01); *B81B 2201/0257* (2013.01); *B81B 2203/0127* (2013.01); *H04R 2201/003* (2013.01)

(58) Field of Classification Search
CPC .. H04R 19/005; H04R 9/06; H04R 2201/003; H04R 9/047; H04R 9/025; H04R 9/02; H04R 7/06; H04R 2400/11; B81B 3/0018; B81B 2201/0257; B81B 2203/0127; B81C 1/00309; B81C 2203/0109
See application file for complete search history.

(56) References Cited

U.S. PATENT DOCUMENTS

| 2009/0016563 | A1* | 1/2009 | Wei ......................... | H04R 9/02 |
| | | | | 381/430 |
| 2015/0071483 | A1* | 3/2015 | Shinotsuka .............. | H04R 9/04 |
| | | | | 381/423 |
| 2016/0037265 | A1* | 2/2016 | Khenkin ................ | H04R 19/04 |
| | | | | 381/174 |
| 2022/0150636 | A1* | 5/2022 | Chou ....................... | H04R 7/06 |

FOREIGN PATENT DOCUMENTS

| CN | 106454668 A | * | 2/2017 | ............ H04R 19/04 |
| WO | WO-2018223987 A1 | * | 12/2018 | ............ H04R 9/025 |

* cited by examiner

*Primary Examiner* — Oyesola C Ojo
(74) *Attorney, Agent, or Firm* — McClure, Qualey & Rodack, LLP

(57) ABSTRACT

A package structure of a micro speaker includes a substrate, a diaphragm, a coil, a carrier board, a lid, a first permanent magnetic element, and a second permanent magnetic element. The substrate has a hollow chamber. The diaphragm is suspended over the hollow chamber. The coil is embedded in the diaphragm. The carrier board is disposed on the bottom surface of the substrate. The first permanent magnetic element is disposed on the carrier board and in the hollow chamber. The lid is wrapped around the substrate and the diaphragm. The lid exposes a portion of the top surface of the diaphragm. The second permanent magnetic element is disposed either above the lid or under the lid.

14 Claims, 10 Drawing Sheets

PACKAGE STRUCTURE OF MICRO SPEAKER

CROSS-REFERENCE TO RELATED APPLICATIONS

The present application claims priority of China Application No. 202011177909.6, filed on Oct. 29, 2020, which is incorporated by reference herein in its entirety.

BACKGROUND

Technical Field

The disclosure relates to a micro speaker, and more particularly to a package structure of a micro speaker and methods for forming the same.

Description of the Related Art

Since electronic products are becoming smaller and thinner, how to scale down the size of electronic products has become an important topic. Micro electromechanical system (MEMS) technology is a technology that combines semiconductor processing and mechanical engineering, which can effectively reduce the size of components and produce multi-functional micro elements and micro systems.

At present, there are quite a few products that are manufactured using micro electromechanical system, such as micro accelerometers, micro gyros, micro magnetometers, and sensors. The manufacturing of traditional moving coil speakers has become quite mature, but the traditional moving coil speakers have a larger area and are more expensive. If the micro electromechanical system process is used to manufacture a moving coil speaker on a semiconductor chip, the area will be reduced and the cost will be reduced, which is conducive to batch production. However, in addition to reducing the size to facilitate manufacturing, it is still necessary to develop a micro moving coil speaker with better frequency response.

SUMMARY

Some embodiments of the present disclosure provide a package structure of a micro speaker. The structure includes a substrate having a hollow chamber; a diaphragm suspended over the hollow chamber; a coil embedded in the diaphragm; a carrier board disposed on the bottom surface of the substrate; a first permanent magnetic element disposed on the carrier board and in the hollow chamber; a lid wrapped around the substrate and the diaphragm, wherein an end of the lid exposes a portion of a top surface of the diaphragm; and a second permanent magnetic element disposed above the diaphragm.

In some embodiments, the diaphragm includes polydimethylsiloxane (PDMS), phenolic epoxy resin, polyimide, or a combination thereof.

In some embodiments, the carrier board includes an air hole, and the air hole allows the hollow chamber to communicate with the external environment.

In some embodiments, the lid includes metals with magnetic permeability lower than $1.25 \times 10^{-4}$ H/m.

In some embodiments, the second permanent magnetic element is disposed under the end of the lid.

In some embodiments, the second permanent magnetic element is disposed on the end of the lid, and the end of the lid includes a trough to accommodate the second permanent magnetic element.

In some embodiments, the Young's modulus of the diaphragm is between 1 MPa and 100 GPa.

In some embodiments, the thickness of the diaphragm is between 0.1 μm and 20 μm.

In some embodiments, the coil includes a first metal layer and a second metal layer, and the first metal layer is electrically connected to the second metal layer in an opening of the diaphragm.

In some embodiments, the first metal layer and the second metal layer each includes aluminum silicon, aluminum, copper, or a combination thereof.

In some embodiments, the width of the first metal layer and the width of the second metal layer are between 1 μm and 500 μm, and the thickness of the first metal layer and the thickness of the second metal layer are between 0.1 μm and 20 μm.

In some embodiments, the first metal layer includes a spiral structure surrounding the central axis of the diaphragm, and the second metal layer crosses the spiral structure and is electrically connected to the first metal layer.

In some embodiments, the first metal layer includes a wavy structure, and the wavy structure connects the spiral structure to the opening.

In some embodiments, further comprising a dielectric layer disposed between the first metal layer and the second metal layer, wherein the dielectric layer includes via holes, and the first metal layer is electrically connected to the second metal layer through the via holes.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1A:
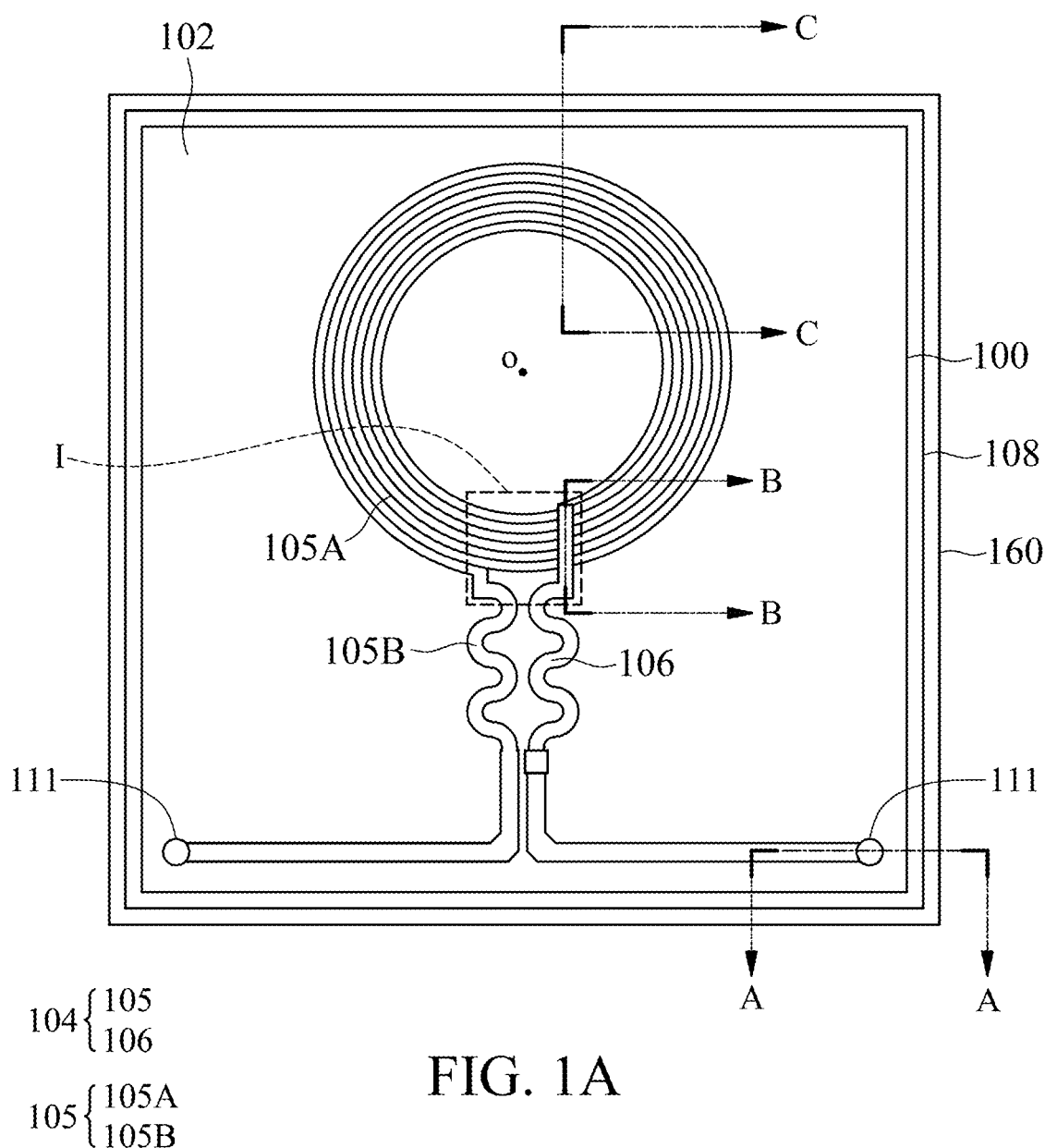
FIG. 1A illustrates a top view of an exemplary package structure of a micro speaker according to some embodiments of the present disclosure.

In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

In addition, the present disclosure may repeat reference numerals and/or letters in the various examples. This repetition is for the purpose of simplicity and clarity and does not in itself dictate a relationship between the various embodiments and/or configurations discussed. Some variations of embodiments are described below. In different figures and illustrated embodiments, similar element symbols are used to indicate similar elements.

The drawings provided are only schematic diagrams and are non-limiting. In the drawings, the size, shape, or thickness of some of the elements may be exaggerated and not drawn to scale, for illustrative purposes. The dimensions and the relative dimensions do not correspond to actual location in the practice of the disclosure. The disclosure will be described with respect to particular embodiments and with reference to certain drawings, but the disclosure is not limited thereto.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Furthermore, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

The term "permanent magnetic element" used in the present disclosure refers to an element that can maintain magnetism for a long time. That is, the permanent magnetic element is not easy to lose magnetism and is not easy to be magnetized. In addition, permanent magnetic elements can also be referred to as "hard magnetic elements."

Some embodiments of the present disclosure provide a package structure of a micro speaker. A permanent magnetic element is disposed under a diaphragm, and the magnetic field generated by the permanent magnetic element interacts with a current passing through a multilayer coil to generate a force in a normal direction of a substrate to make the diaphragm vibrate to generate sound. There is another permanent magnetic element above or under a lid of the package structure. The permanent magnetic element and the permanent magnetic element under the diaphragm attract each other to increase the deflection of the plane magnetic field. The current passing through the multilayer coil and the planar magnetic field produce an increased force in the normal direction of the substrate, which makes the diaphragm have a higher frequency response and thus has better performance.

FIG. 1A illustrates a top view of an exemplary package structure 10 of a micro speaker according to some embodiments of the present disclosure. As shown in FIG. 1A, the package structure 10 of the micro speaker includes a substrate 100, a diaphragm 102, a multilayer coil 104, a lid 108 and a carrier board 160. It should be noted that in the embodiment shown in FIG. 1A, in order to show the internal structure of the package structure 10 of the micro speaker, the diaphragm 102 and the lid 108 are only represented by rectangles.

Figure 1B:
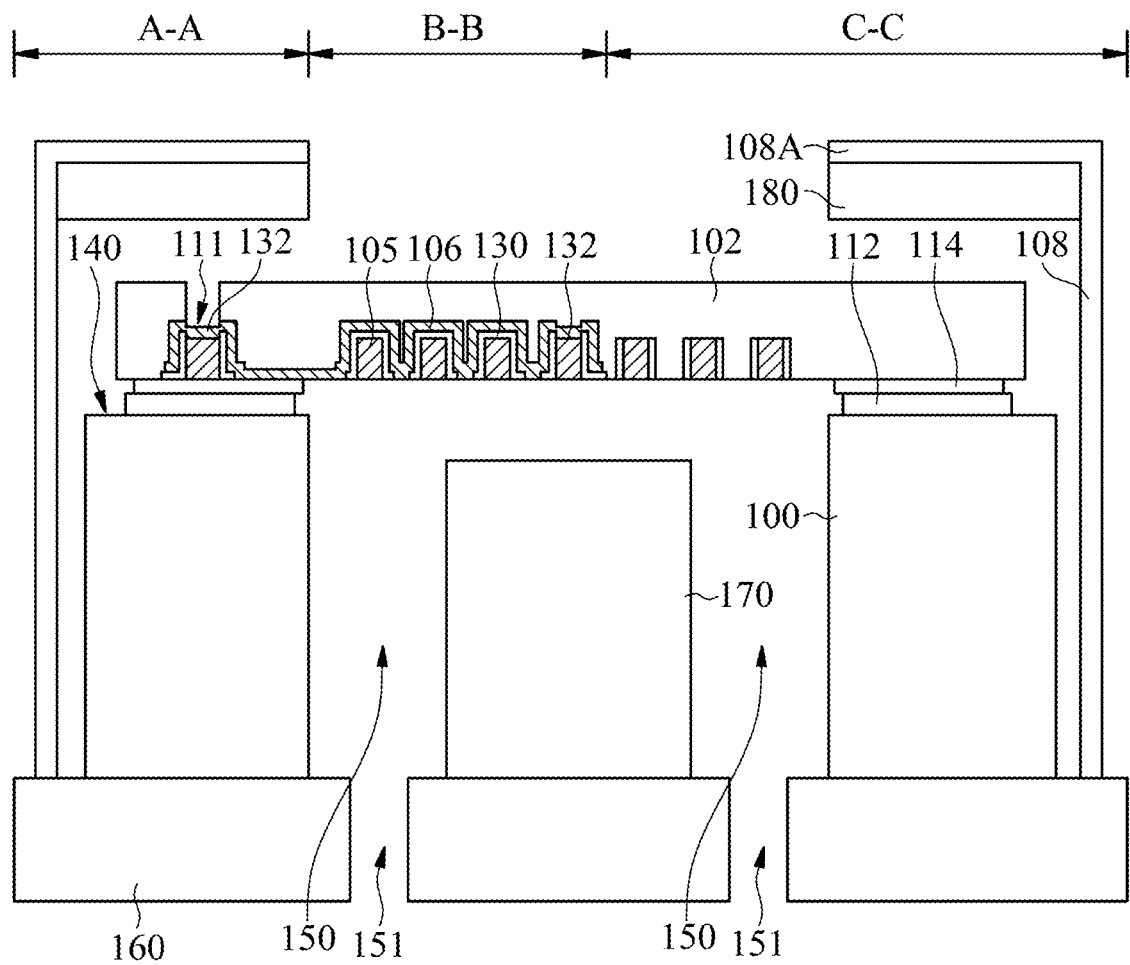
FIG. 1B illustrates a cross-sectional view of an exemplary package structure of a micro speaker according to some embodiments of the present disclosure.

FIG. 1B illustrates the cross-sectional view of the package structure 10 of the micro speaker shown in FIG. 1A according to some embodiments of the present disclosure. As shown in FIG. 1B, the first permanent magnetic element 170 is disposed below the diaphragm 102, and the second permanent magnetic element 180 is disposed above the diaphragm 102. The first permanent magnetic element 170 and the second permanent magnetic element 180 attract each other to further improve the frequency response of the diaphragm 102. It should be noted that, in order to simplify the figure, FIG. 1A does not show the first permanent magnetic element 170 or the second permanent magnetic element 180.

Referring to FIGS. 1A and 1B, the diaphragm 102 is disposed on the substrate 100 and can vibrate up and down in the normal direction of the substrate 100. The multilayer coil 104 is embedded in the diaphragm 102. That is, the multilayer coil 104 is not exposed. The multilayer coil 104 is configured to transmit electrical signals and drive the diaphragm 102 to deform relative to the substrate 100 according to the electrical signals. At present, resistances of speakers are mostly 8Ω or 32Ω, which is lower than that of single-layer coils. The multilayer coils of the present disclosure can easily meet the resistance requirements.

The multilayer coil 104 includes a first metal layer 105 and a second metal layer 106. The first metal layer 105 is electrically connected to the second metal layer 106 in an opening 111 of the diaphragm 102 to transmit electrical signals and control the operation of the package structure 10 of the micro speaker.

In some embodiments, the first metal layer 105 includes a spiral structure 105A located in the center of the diaphragm 102 and a wavy structure 105B extending from the spiral structure 105A to the periphery of the diaphragm 102. The spiral structure 105A surrounds the central axis O of the diaphragm 102, and the wavy structure 105B connects the spiral structure 105A to the opening 111. By providing the wavy structure 105B, the diaphragm 102 can be more flexible and the difficulty of vibration can be reduced.

Figure 2:
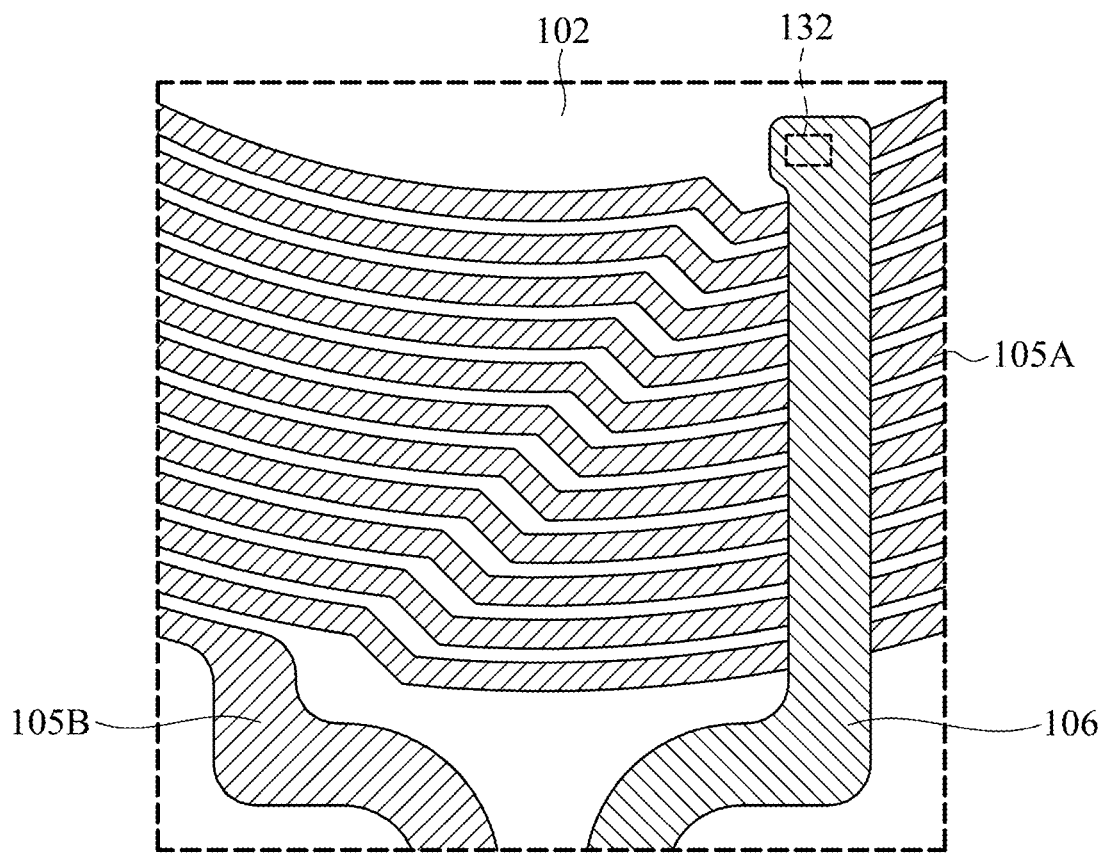
FIG. 2 illustrates an enlarged schematic diagram of the area I shown in FIG. 1A according to some embodiments of the present disclosure.

FIG. 2 illustrates an enlarged schematic diagram of the area I shown in FIG. 1A according to some embodiments of the present disclosure. Referring to FIGS. 1B and 2, the first metal layer 105 and the second metal layer 106 are located on different levels, and the second metal layer 106 is higher than the first metal layer 105. That is, the second metal layer 106 is closer to the top of the diaphragm 102 than the first metal layer 105.

A dielectric layer 130 is disposed between the first metal layer 105 and the second metal layer 106 to prevent a short circuit between the first metal layer 105 and the second metal layer 106. A via hole 132 is formed in the dielectric layer 130. The second metal layer 106 crosses the spiral structure 105A and is electrically connected to the first metal layer 105 through the via hole 132. The detailed manufacturing process of the package structure 10 will be described below in conjunction with FIGS. 3A to 3F.

FIGS. 3A to 3F show schematic cross-sectional views of the package structure 10 shown in FIG. 1 during the manufacturing process. It should be understood that each of FIGS. 3A to 3F includes a cross-sectional view along the lines A-A, B-B, and C-C shown in FIG. 1. In this way, the manufacturing processes of different parts of the package structure 10 can be shown in a single figure.

Figure 3A:
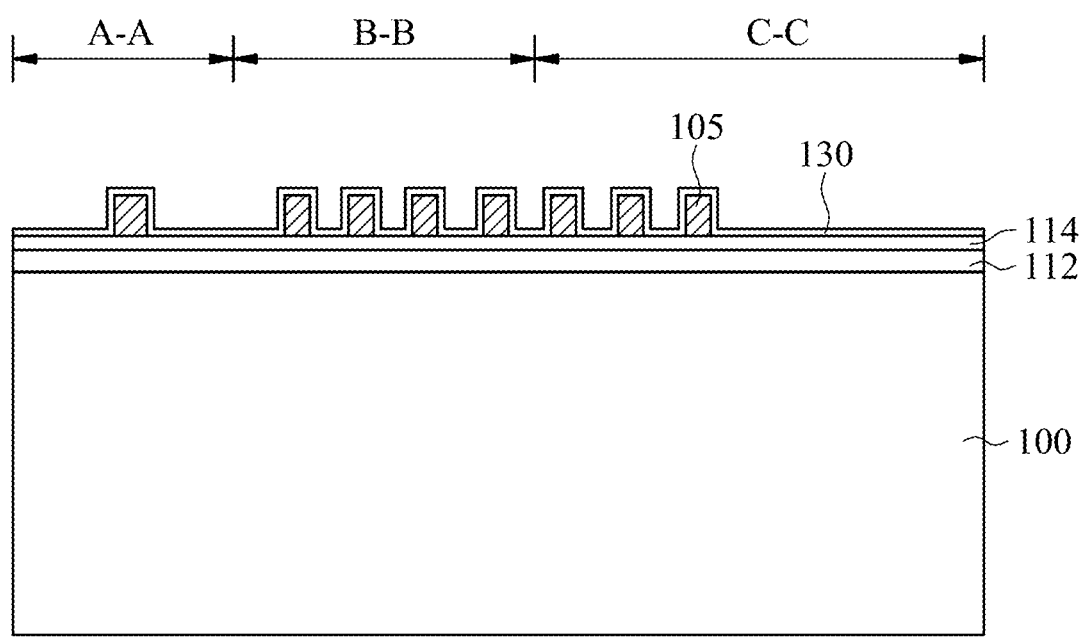
FIGS. 3A-3F illustrate cross-sectional views of a packaging structure of a micro speaker at intermediate stages of manufacturing according to some embodiments of the present disclosure.

Referring to FIG. 3A, dielectric layers 112 and 114 are formed on the substrate 100. In some embodiments, the substrate 100 may be part of a semiconductor wafer. In some embodiments, the substrate 100 may be formed of silicon (Si) or other semiconductor materials. Alternatively or additionally, the substrate 100 may include other element semiconductor materials, such as germanium (Ge). In some embodiments, the substrate 100 may be formed of a compound semiconductor, such as silicon carbide (SiC), gallium arsenide (GaAs), indium arsenide (InAs), or indium phosphide (InP). In some embodiments, the substrate 100 may be formed of an alloy semiconductor, such as silicon germanium (SiGe), silicon germanium carbide (SiGeC), gallium arsenide phosphide (GaAsP), or indium gallium phosphide (InGaP). In some embodiments, the thickness of the substrate 100 may be between about 100 µm and about 1000 µm.

In some embodiments, the dielectric layer 112 may be silicon dioxide ($SiO_2$) or other oxides or nitrides that can be used as a dielectric layer. The dielectric layer 112 may be formed on the substrate 100 through thermal oxidation, chemical vapor deposition (CVD), low pressure CVD (LPCVD), atmospheric pressure CVD (APCVD), plasma-enhanced chemical vapor deposition (PECVD), or a combination thereof.

In some embodiments, the dielectric layer 114 may be silicon dioxide ($SiO_2$) or other oxides or nitrides that can be used as a dielectric layer. The dielectric layer 114 may be formed on the dielectric layer 112 through thermal oxidation, chemical vapor deposition (CVD), plasma-enhanced chemical vapor deposition (PECVD), or a combination thereof.

Still referring to FIG. 3A, the first metal layer 105 of the multilayer coil 104 is formed on the dielectric layer 114. The first metal layer 105 may be formed through electroplating or physical vapor deposition (PVD), such as sputtering or evaporation coating. Then, the first metal layer 105 is patterned to form the spiral structure 105A and the wavy structure 105B as shown in FIG. 1. The patterning process may include photolithography processes (for example, photoresist coating, soft baking, mask alignment, exposure, post-exposure baking, photoresist development, other suitable processes or a combination thereof), etching processes (for example, wet etching process, dry etching process, other suitable processes or a combination thereof), other suitable processes, or a combination thereof.

In some embodiments, the first metal layer 105 may include aluminum silicon, aluminum, copper, or a combination thereof. In some embodiments, the width of the first metal layer 105 may be between 1 µm and 500 µm, and the thickness of the first metal layer 105 may be between 0.1 µm and 20 µm.

Still referring to FIG. 3A, a dielectric layer 130 is formed on the first metal layer 105 and the dielectric layer 114. In some embodiments, the dielectric layer 130 may be formed through a furnace process or a chemical vapor deposition process. In some embodiments, the dielectric layer 130 may be carbon-doped oxides or other suitable insulating materials.

Figure 3B:
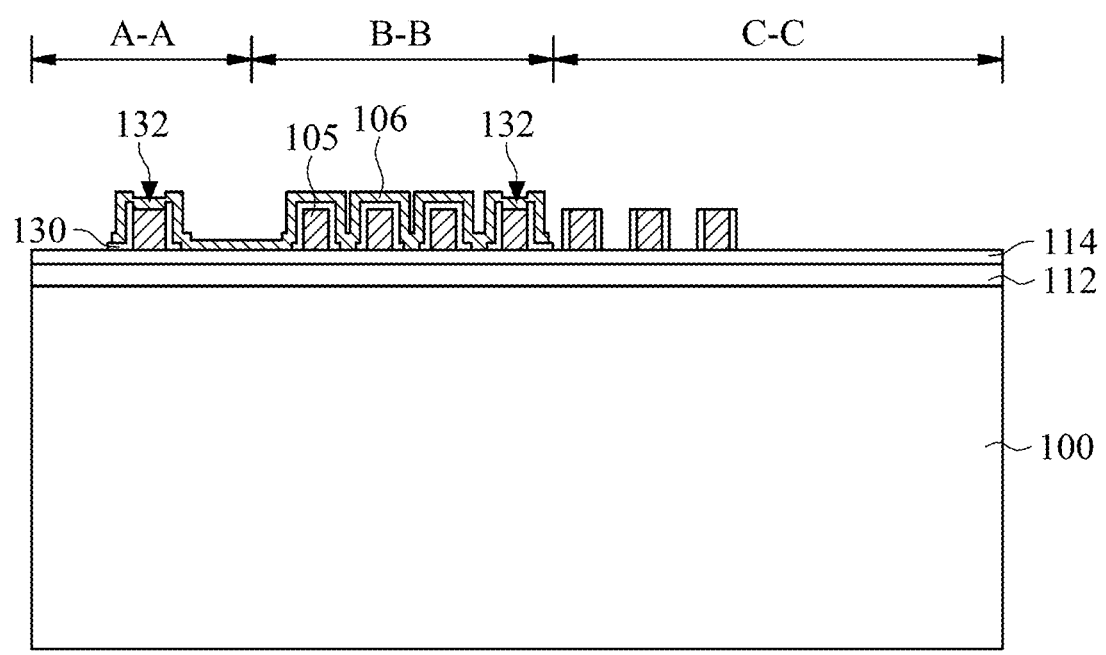

Referring to FIG. 3B, a lithography process and an etching process are performed on the dielectric layer 130 to form a via hole 132 in the dielectric layer 130 and expose a portion of the first metal layer 105. Then, the second metal layer 106 of the multilayer coil 104 is formed on the dielectric layer 130 and the first metal layer 105 through electroplating or physical vapor deposition (for example, sputtering or evaporation coating). The second metal layer 106 is subsequently patterned. It should be noted that the dielectric layer 130 is cut into separate segments through the lithography process and etching process, leaving only the necessary portion to insulate the first metal layer 105 and the second metal layer 106. By removing unnecessary portion of the dielectric layer 130, the diaphragm 102 can be more flexible and thus improve the performance of the package structure.

In some embodiments, the second metal layer 106 may include aluminum silicon, aluminum, copper, or a combination thereof. In some embodiments, the width of the second metal layer 106 may be between 1 µm and 500 µm, and the thickness of the second metal layer 106 may be between 0.1 µm and 20 µm.

Figure 3C:
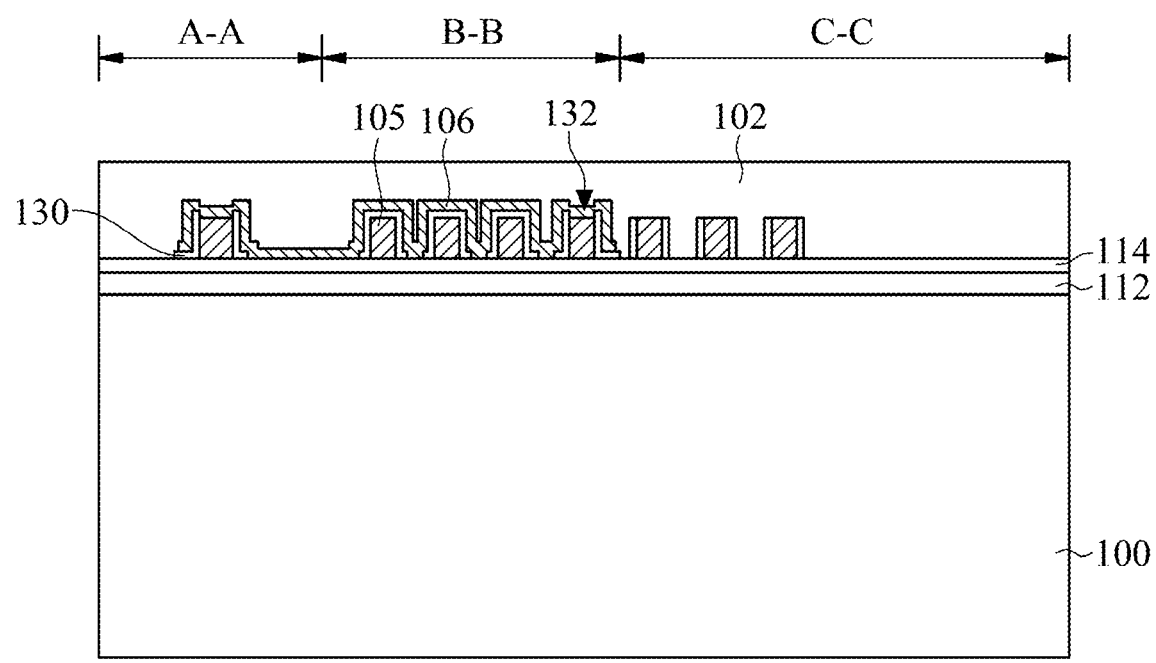

Referring to FIG. 3C, the diaphragm 102 is formed on the second metal layer 106. In some embodiments, the diaphragm 102 may be formed through spin coating, slot-die coating, blade coating, wire bar coating, gravure coating, spray coating, chemical vapor deposition, other suitable methods, or a combination thereof. As shown in FIG. 3C, the first metal layer 105, the second metal layer 106, and the dielectric layer 130 are embedded in the diaphragm 102. In some embodiments, the diaphragm 102 may include polydimethylsiloxane (PDMS), phenolic epoxy resin (such as SU-8), polyimide (PI), or a combination thereof. In one embodiment, the diaphragm 102 is formed of PDMS, and the Young's modulus of the diaphragm 102 is between 1 MPa and 100 GPa. Compared with a film formed of polyimide, the diaphragm 102 formed of PDMS has a smaller Young's modulus and a softer film structure, which makes the diaphragm 102 have a larger displacement, thereby generates a larger sound amplitude. In some embodiments, the thickness of the diaphragm 102 is between about 0.1 µm and about 20 µm.

Figure 3D:
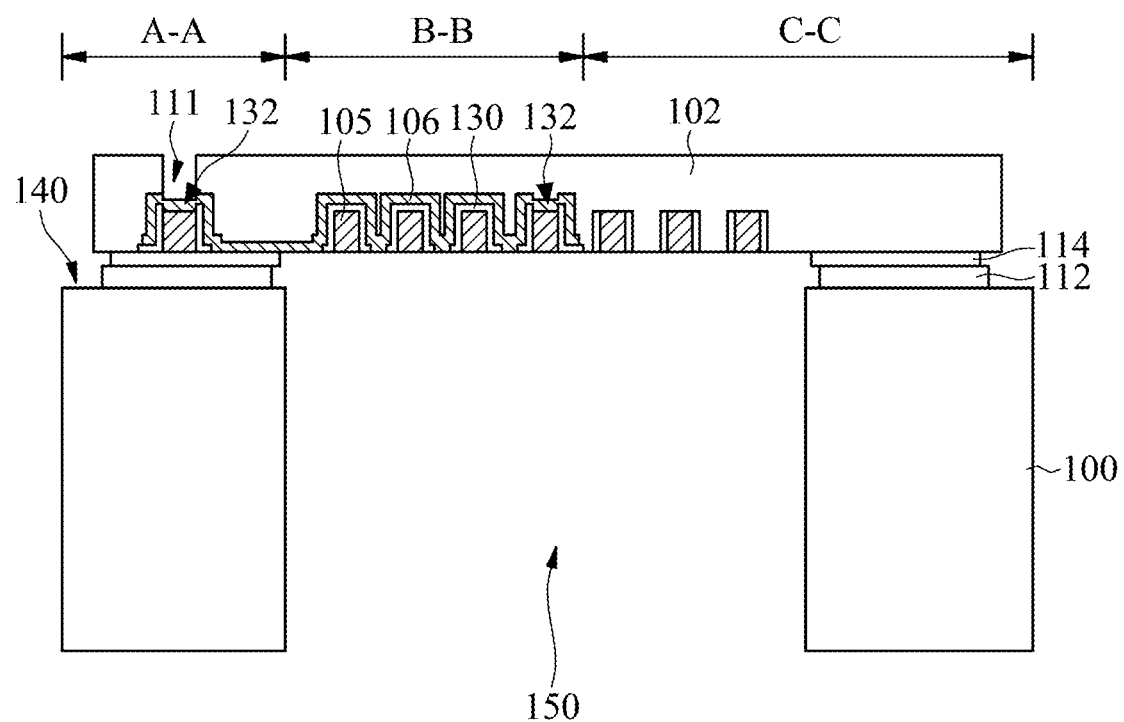

Referring to FIG. 3D, the diaphragm 102 is patterned to form an opening 111 in the diaphragm 102, and a cutting channel 140 is formed around the diaphragm 102. The opening 111 may expose the second metal layer 106. The first metal layer 105 is electrically connected to the second metal layer 106 in the opening 111. The cutting channel 140 may define an area of each package structure on the wafer. In this way, the cutting channel 140 may facilitate cutting (for example, laser cutting) to separate the package structure.

Still referring to FIG. 3D, a deep reactive-ion etching process or an etching process which applies an etchant (such as ammonium hydroxide ($NH_4OH$), hydrofluoric acid (HF), deionized water, tetramethylammonium hydroxide (TMAH), potassium hydroxide (KOH)) is performed on the substrate 100 to form a hollow chamber 150 in the substrate 100. As shown in FIG. 3D, the diaphragm 102 is suspended over the hollow chamber 150. It should be noted that the dielectric layers 112 and 114 may be used as etch stop layers to protect the diaphragm 102 and the multilayer coil 104 from being etched. Since the etching rates of the dielectric layers 112 and 114 may be different, after the etching process, the dielectric layers 112 and 114 may not completely overlap. For example, the dielectric layer 112 may shrink to form a trough on the side facing the hollow chamber 150.

Figure 3E:
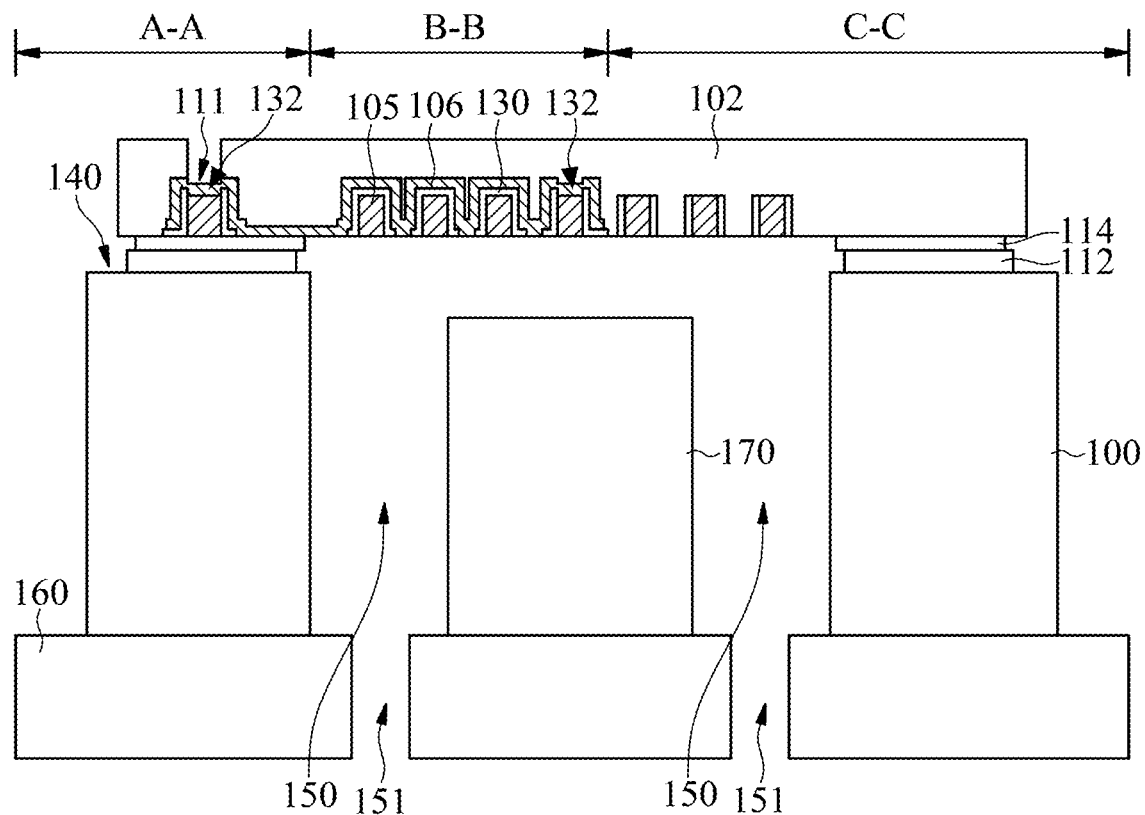

Referring to FIG. 3E, a carrier board 160 is disposed on the bottom surface of the substrate 100. In some embodiments, the carrier board 160 may include a printed circuit board (PCB). The carrier 160 board includes air holes 151 which allow the hollow chamber 150 to communicate with the external environment. The first permanent magnetic element 170 is disposed on the carrier board 160 and is accommodated in the hollow chamber 150. The first permanent magnetic element 170 is configured to cooperate with the multilayer coil 104 to generate a force toward the normal direction of the substrate 100, and the diaphragm 102 can vibrate relative to the substrate 100 according to the force. In some embodiments, the first permanent magnetic element 170 may include a neodymium iron boron magnet.

Figure 3F:
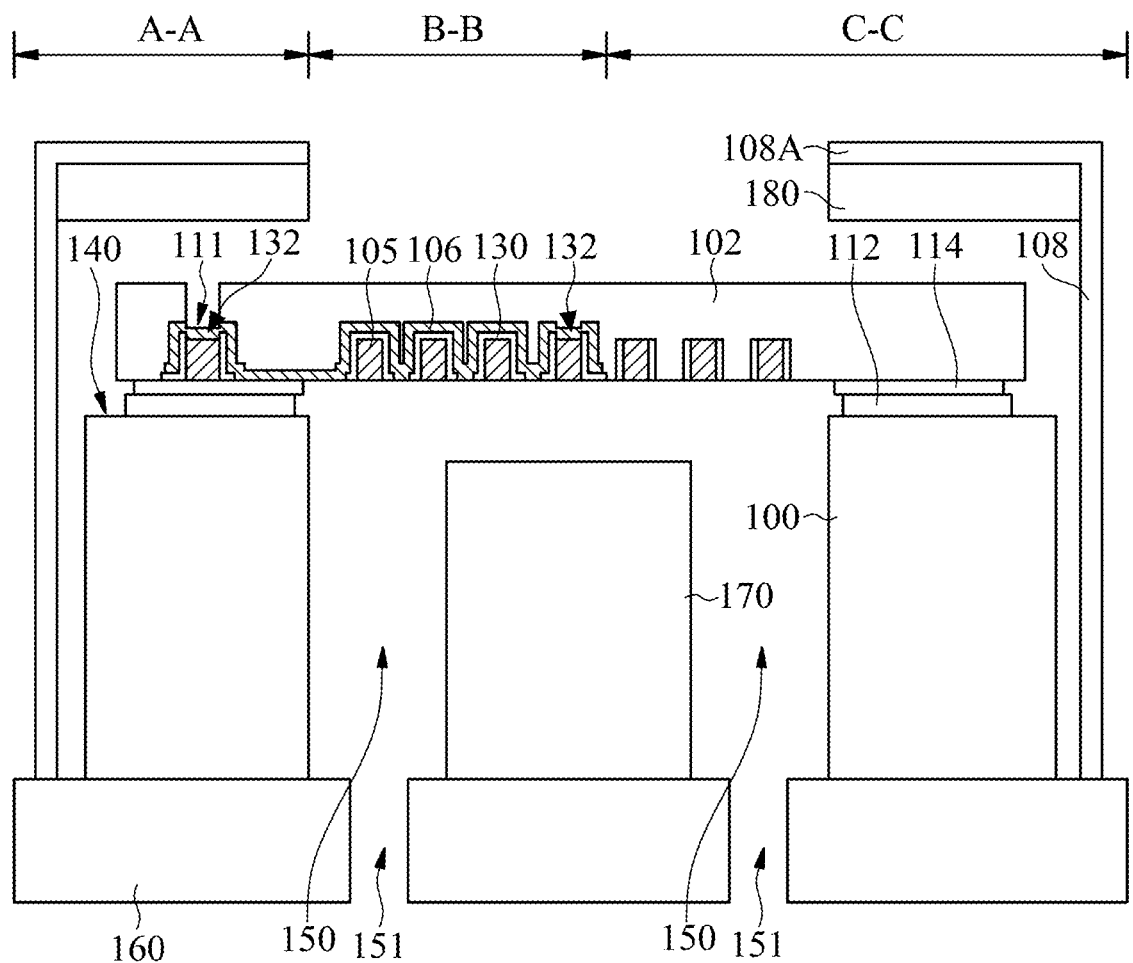

Referring to FIG. 3F, a lid 108 is disposed on the carrier board 160. The lid 108 wraps around the substrate 100 and the diaphragm 102, and the end 108A of the lid 108 exposes a portion of the top surface of the diaphragm 102. In some embodiments, the lid may include metals with magnetic permeability lower than $1.25 \times 10^{-4}$ H/mm such as gold (Au), copper (Cu), aluminum (Al), or a combination thereof.

Still referring to FIG. 3F, the second permanent magnetic element 180 is disposed above the diaphragm 102. In some embodiments, the second permanent magnetic element 180 is disposed under the end 108A of the lid. The second permanent magnetic element 180 and the first permanent magnetic element 170 attract each other to increase the deflection of the planar magnetic field. The force generated by the current passing through the multilayer coil 104 and the planar magnetic field in the normal direction of the substrate 100 is increased, so that the diaphragm 102 has a better frequency response, thereby improving the performance of the package structure. In some embodiments, the second permanent magnetic element 180 may include a neodymium iron boron magnet.

In some embodiments, the distance between the first permanent magnetic element 170 and the second permanent magnetic element 180 may be between 200 μm and 1000 μm. If the distance between the first permanent magnetic element 170 and the second permanent magnetic element 180 is greater than 1000 μm, there may not be sufficient attractive force between the two to increase the deflection of the planar magnetic field, resulting in a smaller frequency response of the package structure, thereby reducing the performance of the package structure. If the distance between the first permanent magnetic element 170 and the second permanent magnetic element 180 is less than 200 μm, when the diaphragm 102 deforms up and down relative to the substrate 100, it may repeatedly contact and strike the first permanent magnetic element 170 and the second permanent magnetic element 180, which causes damage to the package structure, thereby reducing the reliability of the package structure.

Figure 4:
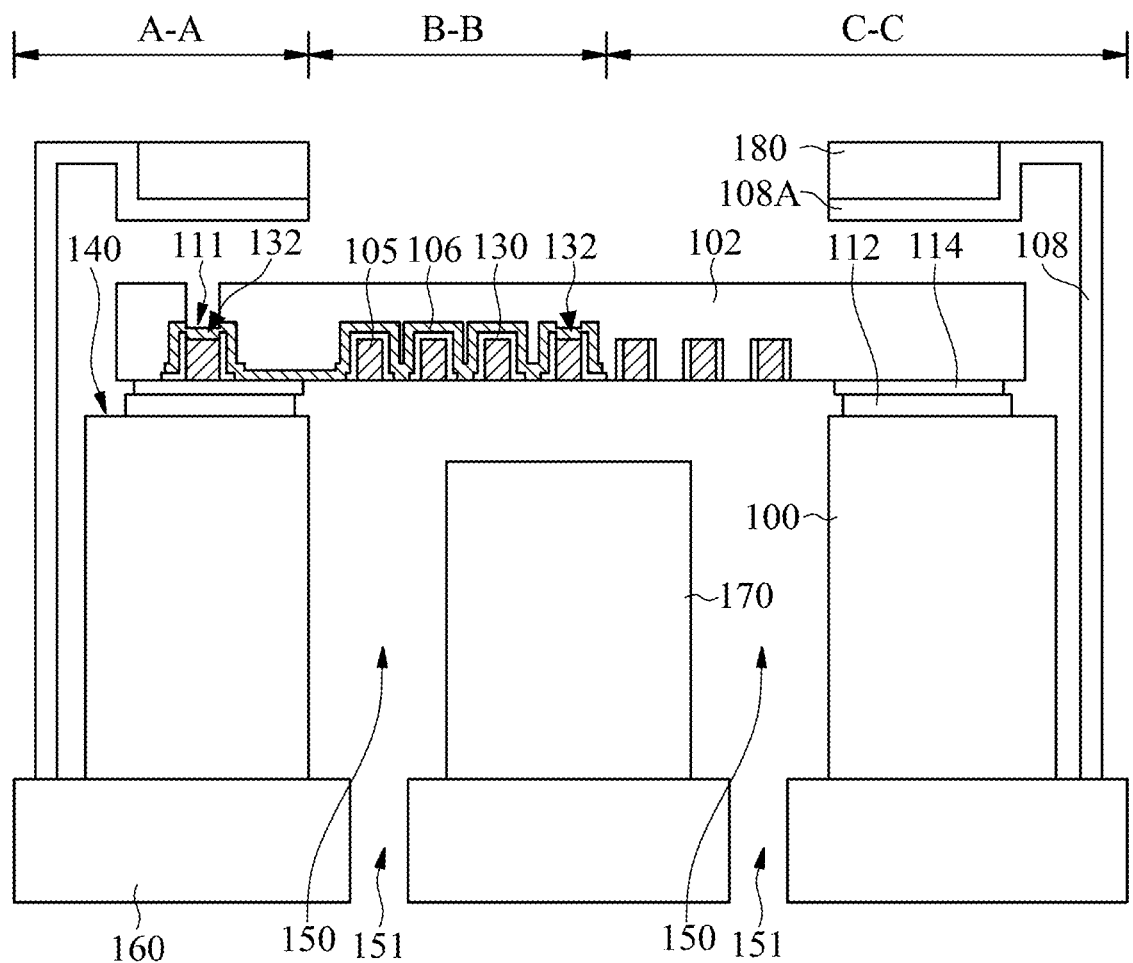
FIG. 4 illustrates a cross-sectional view of a package structure of a micro speaker according to other embodiments of the present disclosure.

FIG. 4 illustrates a cross-sectional view of a package structure of a micro speaker according to other embodiments of the present disclosure. Compared with the embodiment shown in FIG. 3F, the second permanent magnetic element 180 of the package structure shown in FIG. 4 is disposed on the end 108A of the lid 108. As shown in FIG. 4, the end 108A of the lid 108 includes a trough, so that the second permanent magnetic element 180 can be more stably disposed on the end 108A, and it is not easy to fall off due to external forces. In addition, the design of the end 108A described above may reduce the complexity of the manufacturing process and improve the reliability of the product.

To sum up, various embodiments of the present disclosure provide the package structure of the micro speaker. The permanent magnetic element is disposed under the diaphragm, and the magnetic field generated by the permanent magnetic element interacts with the current passing through the multilayer coil to generate the force in the normal direction of the substrate to make the diaphragm vibrate to generate sound. There is another permanent magnetic element above or under the lid of the package structure. The permanent magnetic element and the permanent magnetic element under the diaphragm attract each other to increase the deflection of the plane magnetic field. The current passing through the multilayer coil and the planar magnetic field produce an increased force in the normal direction of the substrate, which makes the diaphragm have a higher frequency response and thus has better performance.

In addition, the coil is formed on the semiconductor wafer and covered with the diaphragm, so that the coil is embedded in the diaphragm. It can reduce the difficulty of the manufacturing process, and prevent the connection points of the multilayer coil from being broken due to long-term vibration, thereby improving the reliability of the product. Furthermore, due to the use of micro electromechanical process technology, the package structure of the micro speaker of the present disclosure has the advantages of batch production, high consistency, high yield, small area, and low cost.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A package structure of a micro speaker, comprising:
a substrate having a hollow chamber;
a diaphragm suspended over the hollow chamber;
a coil embedded in the diaphragm;
a carrier board disposed on a bottom surface of the substrate;
a first permanent magnetic element disposed on the carrier board and in the hollow chamber;
a lid wrapped around the substrate and the diaphragm, wherein an end of the lid exposes a portion of a top surface of the diaphragm; and
a second permanent magnetic element disposed above the diaphragm.

2. The package structure of the micro speaker as claimed in claim 1, wherein the diaphragm comprises polydimethylsiloxane (PDMS), phenolic epoxy resin, polyimide, or a combination thereof.

3. The package structure of the micro speaker as claimed in claim 1, wherein the carrier board comprises an air hole, and the air hole allows the hollow chamber to communicate with an external environment.

4. The package structure of the micro speaker as claimed in claim 1, wherein the lid comprises a metal with magnetic permeability lower than $1.25 \times 10^{-4}$ H/m.

5. The package structure of the micro speaker as claimed in claim 1, wherein the second permanent magnetic element is disposed under the end of the lid.

6. The package structure of the micro speaker as claimed in claim 1, wherein the second permanent magnetic element is disposed on the end of the lid, and the end of the lid comprises a trough to accommodate the second permanent magnetic element.

7. The package structure of the micro speaker as claimed in claim 1, wherein a Young's modulus of the diaphragm is between 1 MPa and 100 GPa.

8. The package structure of the micro speaker as claimed in claim 1, wherein a thickness of the diaphragm is between 0.1 μm and 20 μm.

9. The package structure of the micro speaker as claimed in claim 1, wherein the coil comprises a first metal layer and a second metal layer, and the first metal layer is electrically connected to the second metal layer in an opening of the diaphragm.

10. The package structure of the micro speaker as claimed in claim 9, wherein the first metal layer and the second metal layer each comprises aluminum silicon, aluminum, copper, or a combination thereof.

11. The package structure of the micro speaker as claimed in claim 9, wherein a width of the first metal layer and a width of the second metal layer are between 1 μm and 500 μm, and a thickness of the first metal layer and a thickness of the second metal layer are between 0.1 μm and 20 μm.

12. The package structure of the micro speaker as claimed in claim 9, wherein the first metal layer comprises a spiral structure surrounding a central axis of the diaphragm, and the second metal layer crosses the spiral structure and is electrically connected to the first metal layer.

13. The package structure of the micro speaker as claimed in claim 12, wherein the first metal layer comprises a wavy structure, and the wavy structure connects the spiral structure to the opening.

14. The package structure of the micro speaker as claimed in claim 9, further comprising a dielectric layer disposed between the first metal layer and the second metal layer, wherein the dielectric layer comprises via holes, and the first metal layer is electrically connected to the second metal layer through the via holes.

* * * * *